United States Patent
Inoue et al.

(10) Patent No.: US 9,231,553 B2
(45) Date of Patent: Jan. 5, 2016

(54) ACOUSTIC WAVE FILTER

(75) Inventors: Kazunori Inoue, Tokyo (JP); Takashi Matsuda, Tokyo (JP); Michio Miura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 938 days.

(21) Appl. No.: 13/344,274

(22) Filed: Jan. 5, 2012

(65) Prior Publication Data
US 2012/0105298 A1     May 3, 2012

Related U.S. Application Data

(63) Continuation of application No. PCT/JP2010/064776, filed on Aug. 31, 2010.

(30) Foreign Application Priority Data

Sep. 28, 2009    (JP) ................................ 2009-223283

(51) Int. Cl.
*H03H 9/02* (2006.01)
*H03H 9/72* (2006.01)
*H03H 9/64* (2006.01)

(52) U.S. Cl.
CPC ......... *H03H 9/02992* (2013.01); *H03H 9/6483* (2013.01); *H03H 9/725* (2013.01); *H03H 9/02952* (2013.01)

(58) Field of Classification Search
CPC .......... H03H 9/02952; H03H 9/02992; H03H 9/6483; H03H 9/725
USPC .......... 333/133, 193–196; 310/313 B, 313 D, 310/364
See application file for complete search history.

(56) References Cited

U.S. PATENT DOCUMENTS

| | | | |
|---|---|---|---|
| 2002/0024271 A1* | 2/2002 | Hori et al. | 310/364 |
| 2003/0107454 A1* | 6/2003 | Nakamura et al. | 333/133 |
| 2004/0196119 A1 | 10/2004 | Shibahara et al. | |

(Continued)

FOREIGN PATENT DOCUMENTS

| | | |
|---|---|---|
| JP | 2000-183679 A | 6/2000 |
| JP | 2004-282707 A | 10/2004 |
| JP | 2009-232138 A | 10/2009 |
| WO | 2009/057195 A1 | 5/2009 |

OTHER PUBLICATIONS

Japanese Office Action dated Apr. 9, 2013, in a counterpart Japanese patent application No. 2009-223283.

(Continued)

*Primary Examiner* — Benny Lee
*Assistant Examiner* — Jorge Salazar, Jr.
(74) *Attorney, Agent, or Firm* — Chen Yoshimura LLP

(57) ABSTRACT

A configuration that reduces a parasitic capacitance between wires is achieved at a low cost. Disclosed is an acoustic wave filter provided with a piezoelectric substrate, resonators that include a comb-shaped electrode formed on the piezoelectric substrate, a wiring portion that is connected to the comb-shaped electrode, and a dielectric layer formed to cover the comb-shaped electrode. The wiring portion is provided with a lower layer wiring portion that is disposed in the same layer as the comb-shaped electrode and an upper layer wiring portion that is disposed on the lower layer wiring portion. The upper layer wiring portion includes a region that has a wider electrode width than the electrode width of the lower layer wiring portion.

13 Claims, 8 Drawing Sheets

(56) References Cited

U.S. PATENT DOCUMENTS

2009/0236934 A1 9/2009 Aikawa et al.
2010/0148890 A1 6/2010 Inoue et al.

OTHER PUBLICATIONS

English translation of Written Opinion (PCT/ISA/237) issued in PCT/JP2010/064776 mailed in Oct. 2010. (Japanese Written Opinion and a cited reference have been submitted in a previous IDS.).

International Search Report (ISR) issued in PCT/JP2010/064776 (parent application) mailed in Oct. 2010 for Examiner consideration, citing U.S. Patent Application Publication Nos. 1-2 and Foreign Patent document Nos. 1-3 listed above.

Written Opinion (PCT/ISA/237) issued in PCT/JP2010/064776 (parent application) mailed in Oct. 2010. Concise Explanation of Relevance: This Written Opinion considers some of the claims are described by or obvious over the reference No. 2 cited in ISR above.

\* cited by examiner

ACOUSTIC WAVE FILTER

This application is a continuation of PCT International Application No. PCT/JP2010/064776 designating the United States, filed Aug. 31, 2010, which claims the benefit of Japanese Application No. 2009-223283, filed in Japan on Sep. 28, 2009. Both applications are hereby incorporated by reference in their entireties.

TECHNICAL FIELD

The present application relates to an acoustic wave filter.

BACKGROUND ART

There has been a demand for high-frequency devices used in mobile phones and the like to be smaller in size. High-frequency devices, such as a filter, a duplexer, and the like that use surface acoustic waves (SAW), have been contributing to reducing the size of mobile phones with their features such as their small size and light weight. However, there has been a demand for further reduction in size and higher performance. Reducing the size of filters and duplexers reduces the distance between wires adjacent to each other, and may form a parasitic capacitance between the wires. When a parasitic capacitance is formed between wires, there is a risk that filter characteristics degrade.

Patent Document 1 discloses that in order to reduce a parasitic capacitance formed between wires, an insulating pattern is formed with a resin or the like on a substrate, and that a wiring portion is formed thereon.

RELATED ART DOCUMENTS

Patent Documents

Patent Document 1: Japanese Patent Application Laid-Open Publication No. 2004-282707

SUMMARY OF THE INVENTION

Problems to be Solved by the Invention

Since the high-frequency device disclosed in Patent Document 1 has an insulating pattern for reducing a parasitic capacitance between wires, it leads to a cost increase.

An object of the present invention is to achieve a configuration that reduces a parasitic capacitance between wires at a low cost.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present application discloses an acoustic wave filter that includes a piezoelectric substrate, a comb-shaped electrode formed on the piezoelectric substrate, a wiring portion connected to the comb-shaped electrode, and a dielectric layer formed so as to cover the comb-shaped electrode, wherein the wiring portion includes a lower layer wiring portion disposed in the same layer as the comb-shaped electrode and an upper layer wiring portion disposed on the lower layer wiring portion, and wherein the upper layer wiring portion includes a region having a wider electrode width than an electrode width of the lower layer wiring portion.

In another aspect, the present invention provides an acoustic wave filter, including: a piezoelectric substrate; a comb-shaped electrode formed on the piezoelectric substrate; a wiring portion connected to the comb-shaped electrode; and a dielectric layer formed to cover the comb-shaped electrode, wherein the wiring portion includes a lower layer wiring portion disposed in a same layer as the comb-shaped electrode and an upper layer wiring portion disposed on the lower layer wiring portion, and wherein the upper layer wiring portion has an upper portion and a lower portion, and a width of the upper portion is greater than a width of the lower portion.

According to the disclosure of the present application, a configuration that reduces a parasitic capacitance between wires can be achieved at a low cost.

It is to be understood that both the foregoing general description and the following detailed description are exemplary and explanatory, and are intended to provide further explanation of the invention as claimed.

DETAILED DESCRIPTION OF EMBODIMENTS

Figure 1A:
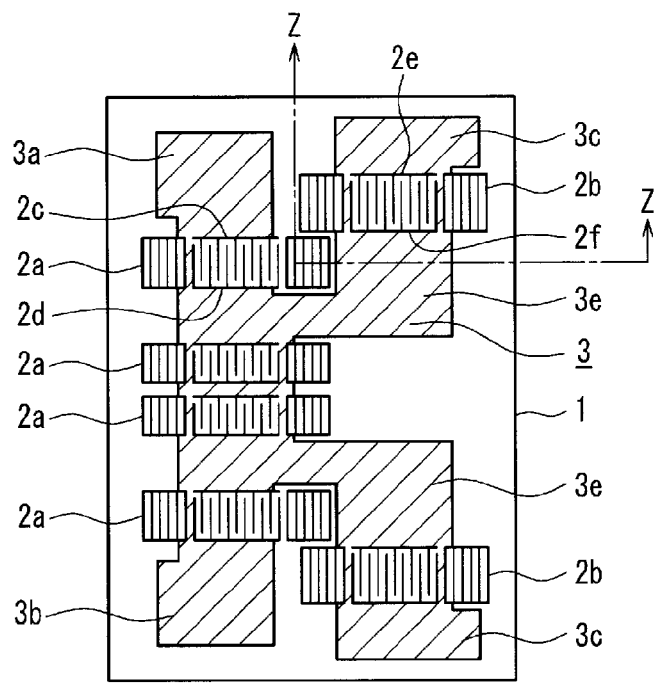
FIG. 1A is a top view of an acoustic wave filter according to Embodiment 1.

An acoustic wave filter according to one aspect of the present invention includes a piezoelectric substrate, a comb-shaped electrode formed on the piezoelectric substrate, a wiring portion connected to the comb-shaped electrode, and a dielectric layer formed so as to cover the comb-shaped electrode. The wiring portion includes a lower layer wiring portion disposed in the same layer as the comb-shaped electrode and an upper layer wiring portion disposed on the lower layer wiring portion. The upper layer wiring portion includes a region having a wider electrode width than an electrode width of the lower layer wiring portion.

The acoustic wave filter may be configured such that the electrode width of the upper layer wiring portion at a portion that is in contact with the lower layer wiring portion is narrower than the electrode width of the lower layer wiring portion.

The acoustic wave filter may be configured such that it has an air gap between the upper layer wiring portion and the dielectric layer.

The acoustic wave filter may be configured such that the upper layer wiring portion includes a plurality of metal layers, and that any one of the plurality of metal layers is formed of a material having a tensile stress or a material having a compressive stress.

Embodiments

1. Configuration of Acoustic Wave Filter

In recent years, the size of communication devices such as mobile phone terminals and the like continues to be reduced further. One of the ways of reducing the size of communication devices is to reduce the size of an acoustic wave filter or to reduce the size of a resonator provided in an acoustic wave filter. However, the size of a resonator in an acoustic wave filter is mostly determined by specifications (impedance and the like) of filter characteristics, and further reduction in its size cannot be expected. Thus, the acoustic wave filter can be reduced in size by reducing the size of a wiring portion that connects resonators together. However, shortening the length of the wiring portion or making the electrode width of the wiring portion narrower increases the resistance value of the wiring portion (hereinafter referred to as the "wiring resistance"), thereby causing a greater loss in the acoustic wave filter.

As one of the measures to reduce the wiring resistance, there exists a method of increasing the thickness of an electrode of a wiring portion. However, the electrode in the wiring portion is formed at the same time as a comb-shaped electrode in the resonator. Because of this, when the thickness of the electrode of the wiring portion is increased, the thickness of the comb-shaped electrode increases as well. As the thickness of the comb-shaped electrode in the resonator is determined based on characteristics of the resonator and the like, if it is increased in order to reduce the wiring resistance, there may be a risk that desired pass characteristics cannot be obtained. Because of this, there is a method of forming a thick wiring portion after forming the comb-shaped electrode. Regarding an increase in film thickness of the wiring portion, manufacturing costs and adhesivity of the lower layer to the comb-shaped electrode layer need to be taken into account as well. Therefore, significantly thickening the wiring portion is difficult.

Furthermore, if the wiring portion is extended up to the immediate proximity of an adjacent element in order to reduce the wiring resistance, there is a problem that parasitic capacitances between wires and between a wire and an element increase. Especially, because lithium tantalate ($LiTaO_3$) and lithium niobate ($LiNbO_3$), which are used in acoustic wave filters, have a high permittivity $\epsilon$ (approximately $\epsilon=40$), the parasitic capacitances are large. Japanese Patent Application Laid-Open Publication No. 2004-282707 discloses that filter characteristics degrade when the parasitic capacitance between substrate wirings increases.

Japanese Patent Application Laid-Open Publication No. 2004-282707 discloses that in order to reduce the parasitic capacitance, an insulating pattern is formed on a substrate with a resin or the like, and a wiring portion is formed thereon. According to the configuration disclosed in Japanese Patent Application Laid-Open Publication No. 2004-282707, the costs increase since the insulating pattern needs to be formed, and the manufacturing costs increase as well since the man-hour for forming the insulating pattern is needed. Furthermore, because a step is formed between the comb-shaped electrode portion and the wiring portion, there has been a problem of insufficient electrical connection occurring at this step. In addition, the insulating pattern disclosed in Japanese Patent Application Laid-Open Publication No. 2004-282707 is formed of a resin. Therefore, in an acoustic wave filter in which temperature characteristics are improved by covering a surface of the comb-shaped electrode with a dielectric layer, if a resin is present when forming the dielectric layer, depending on the formation conditions of the dielectric layer, there is a possibility that the resin is decomposed and deteriorates or the dielectric layer deteriorates due to a gas, such as water or the like, that is adsorbed in the resin or generated when the resin decomposes. Thus, there has been a problem in that significant changes are required to the manufacturing steps, such as forming a dielectric layer before forming an insulating layer made of a resin and the like.

The embodiments of the present invention are directed to acoustic wave filters in which temperature characteristics are improved by covering a surface of a comb-shaped electrode with a dielectric, and feature a reduction in the parasitic capacitance between wires while securing an electrical connection between the comb-shaped electrode and a wiring portion without forming an insulating layer made of a resin. This way, the size of the acoustic wave filters can be reduced.

Examples of acoustic wave filters according to embodiments of the present invention are described below.

Embodiment 1

Figure 1B:
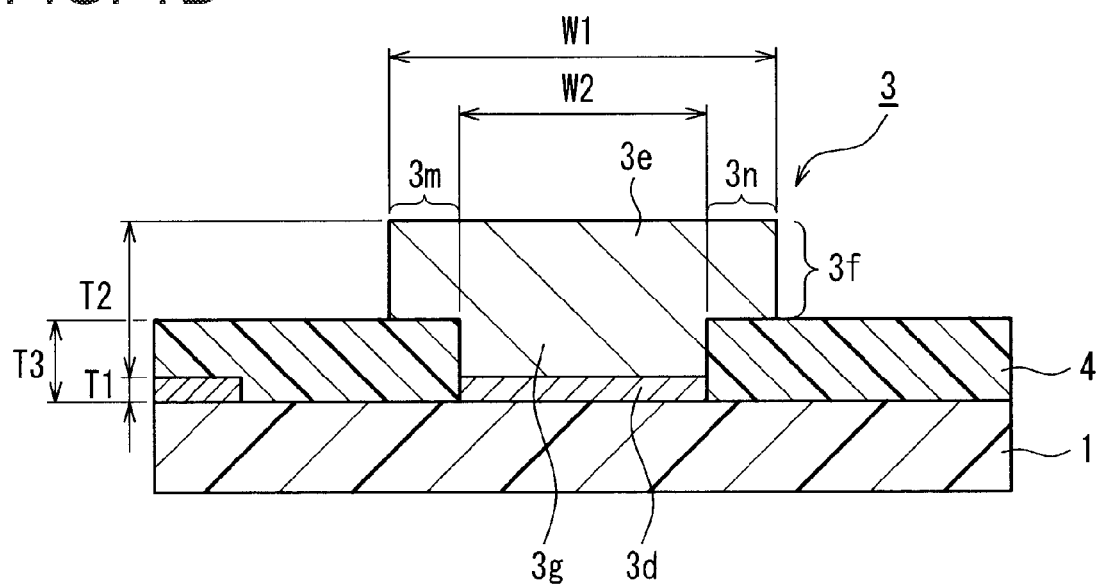
FIG. 1B is a cross-sectional view along the line Z-Z of FIG. 1A.

FIG. 1A is a top view of an acoustic wave filter having a wiring configuration according to Embodiment 1. FIG. 1B is a cross-sectional view along the line Z-Z shown in FIG. 1A.

The acoustic wave filter shown in FIGs. 1A and 1B is provided with a piezoelectric substrate 1, series resonators 2a, parallel resonators 2b, a wiring portion 3, and a dielectric layer 4. The acoustic wave filter of the present embodiment is a ladder filter in which a plurality of resonators are connected together in a ladder shape.

The piezoelectric substrate 1 is a $LiNbO_3$ monocrystalline substrate. In the present embodiment, the piezoelectric substrate 1 was formed of $LiNbO_3$. However, it can be formed of $LiTaO_3$ instead.

The series resonators 2a and the parallel resonators 2b are provided on the piezoelectric substrate 1. The series resonators 2a are connected to a series arm of the acoustic wave filter. The parallel resonators 2b are connected to a parallel arm of the acoustic wave filter. The series resonator 2a is provided with comb-shaped electrodes 2c and 2d that are disposed to face each other. The parallel resonator 2b is provided with comb-shaped electrodes 2e and 2f that are disposed to face each other. The acoustic wave filter can extract signals in an appropriate frequency range due to the resonant frequencies and the anti-resonant frequencies set in the plurality of series resonators 2a and parallel resonators 2b.

The wiring portion 3 is provided on the piezoelectric substrate 1. The wiring portion 3 connects the respective series resonators 2a and parallel resonators 2b together. The wiring portion 3 includes input and output electrodes 3a and 3b, ground electrodes 3c, a lower layer wiring portion 3d, and an upper layer wiring portion 3e. The input and output electrodes 3a and 3b and the ground electrodes 3c are provided with an electrode pad. The lower layer wiring portion 3d and the upper layer wiring portion 3e connect the series resonator 2a to the parallel resonator 2b. The lower layer wiring portion 3d is formed at the same time as when the comb-shaped electrodes 2c to 2f are formed in the series resonator 2a and the parallel resonator 2b on the piezoelectric substrate 1. The lower layer wiring portion 3d can be formed of a multilayer film that has copper (Cu) as the main component, for example, and the film thickness T1 can be set at 130 nm, for example. As shown in FIG. 1B, the upper layer wiring portion 3e is provided on the lower layer wiring portion 3d. The upper layer wiring portion 3e includes an upper layer portion 3f having an electrode width W1 and a lower layer portion 3g having an electrode width W2, which is narrower than the electrode width W1. Because the relation of the electrode widths W1 and W2 is "W1>W2" in the upper layer wiring portion 3e, the end portions 3m and 3n of the upper layer portion 3f project in the principal plane direction of the piezoelectric substrate 1 beyond the lower layer portion 3g. The upper layer wiring portion 3e can be formed of a multilayer film that has Cu as the main component in a manner similar to the lower layer wiring portion 3d, and the film thickness T2 can be set at 2 µm, for example.

At least a portion of the dielectric layer 4 is interposed between the end portions 3m as well as 3n of the upper layer wiring portion 3e and the piezoelectric substrate 1. The dielectric layer 4 can be formed of SiO$_2$. The thickness T3 of the dielectric layer 4 can be set at 720 nm, for example.

Figure 2A:
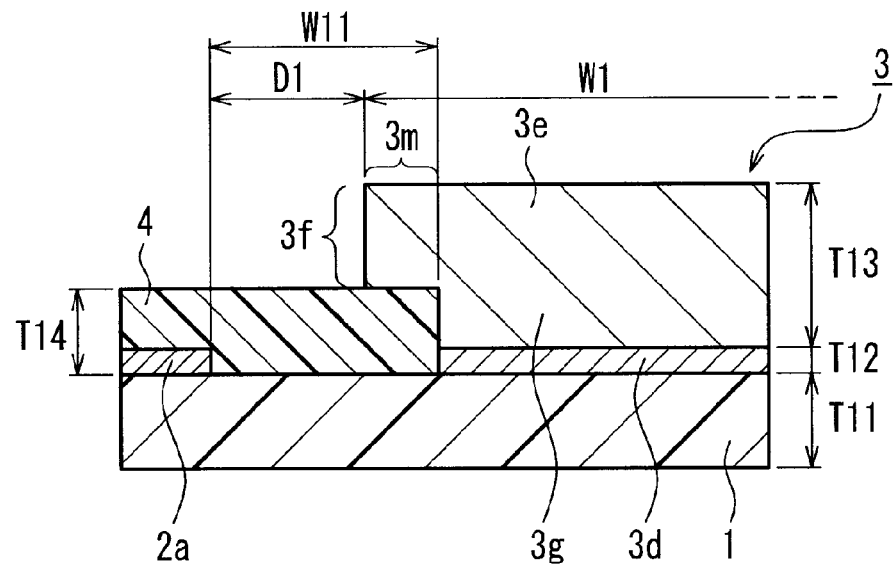
FIG. 2A is a partial cross-sectional view of an acoustic wave filter used in electromagnetic field simulation.
Figure 2B:
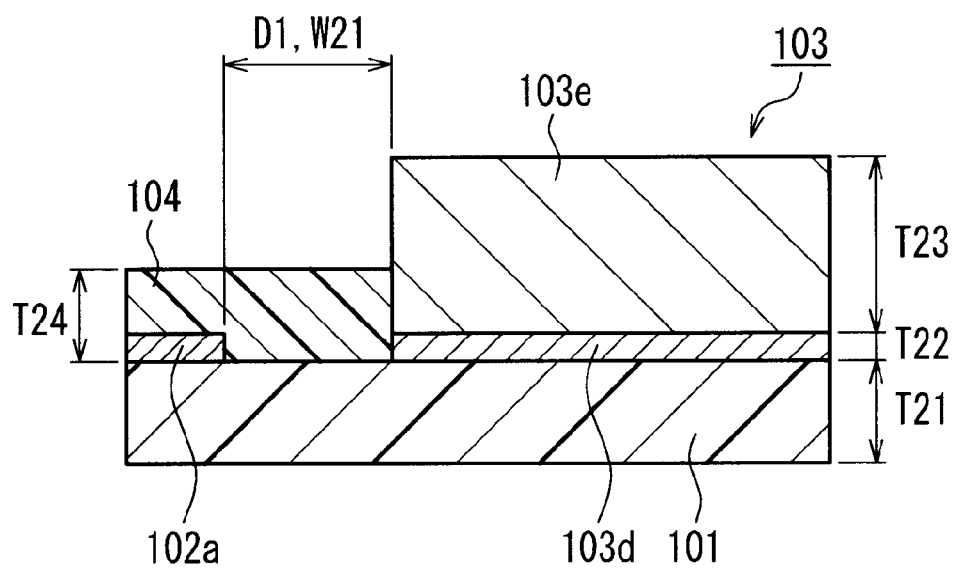
FIG. 2B is a partial cross-sectional view of an acoustic wave filter that is a comparative example used in electromagnetic field simulation.

FIGS. 2A and 2B show partial cross-sectional views of acoustic wave filters used in an electromagnetic field simulation. FIG. 2A shows the configuration of an acoustic wave filter according to the present embodiment. FIG. 2B shows the configuration of an acoustic wave filter that is a comparative example. The acoustic wave filter shown in FIG. 2A is provided with a piezoelectric substrate 1 having a thickness T11 of 50 µm, a series resonator 2a (electrode) and a lower layer wiring portion 3d respectively having a thickness T12 of 130 nm, an upper layer wiring portion 3e having a thickness T13 of 2 µm, and a dielectric layer 4 having a thickness T14 of 720 nm. A distance W11 between the series resonator 2a and the lower layer wiring portion 3d was set to 30 µm. The acoustic wave filter shown in FIG. 2B is provided with a piezoelectric substrate 101 having the thickness T21, which is the same as the thickness T11 shown in FIG. 2A, a series resonator 102a and a lower layer wiring portion 103d respectively having the thickness T22, which is the same as the thickness T12, an upper layer wiring portion 103e having the thickness T23, which is the same as the thickness T13, and a dielectric layer 104 having the thickness T24, which is the same as the thickness T14. The difference between the acoustic wave filter shown in FIG. 2A and the acoustic wave filter shown in FIG. 2B is the shape of the upper layer wiring portion. In the upper layer wiring portion 3e shown in FIG. 2A, the end portion 3m of the upper layer portion 3f projects in the principal plane direction of the piezoelectric substrate 1 relative to the lower layer portion 3g. Thus, an electrode interval D1 between the upper layer wiring portion 3e and the adjacent series resonator 2a is smaller than the distance W11. On the other hand, in the acoustic wave filter shown in FIG. 2B, the upper layer wiring portion 103e and the lower layer wiring portion 103d have the same electrode width. Thus, the electrode interval D1 between the upper layer wiring portion 103e and the adjacent series resonator 102a is the same as the distance W21.

Figure 2C:
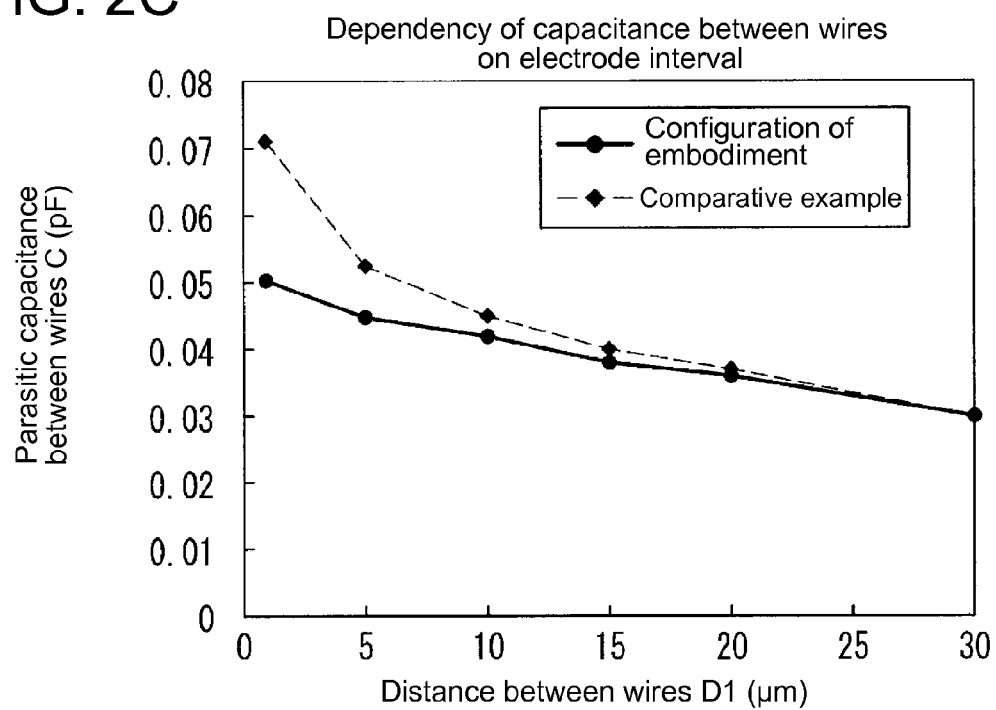
FIG. 2C is a characteristic chart representing electrode interval dependence of a parasitic capacitance.

FIG. 2C shows the results of the electromagnetic field simulation performed using the acoustic wave filter shown in FIG. 2A and the acoustic wave filter shown in FIG. 2B. In the simulation, the value of the parasitic capacitance C formed between the series resonator 2a and the wiring portion 3 when the electrode interval D1 is changed was evaluated for the respective acoustic wave filters shown in FIGS. 2A and 2B. As shown in FIG. 2C, the narrower the electrode interval D1 becomes, the higher the parasitic capacitance C between wires becomes. Particularly, in the case of the acoustic wave filter shown in FIG. 2B, which is the comparative example, when the electrode interval D1 is reduced, the interval between the upper layer wiring portion 103e as well as the lower layer wiring portion 103d and the series resonator 102a is reduced, resulting in a significant increase in the value of the parasitic capacitance C as the electrode interval D1 is reduced. However, in the case of the acoustic wave filter of the present embodiment shown in FIG. 2A, even when the electrode width W1 of the upper layer portion 3f of the upper layer wiring portion 3e is increased to reduce the electrode interval D1, the rate of increase of the parasitic capacitance C is small because the interval W11 between the series resonator 2a and the lower layer wiring portion 3d is kept constant. For example, when the electrode interval D1 is set at 1 µm, the parasitic capacitance C in the acoustic wave filter of the present embodiment is approximately 0.05 pF, while the parasitic capacitance C in the acoustic wave filter of the comparative example is approximately 0.07 pF. Thus, the parasitic capacitance in the acoustic wave filter of the present embodiment is reduced by approximately 30% compared to the acoustic wave filter of the comparative example.

Figure 3:
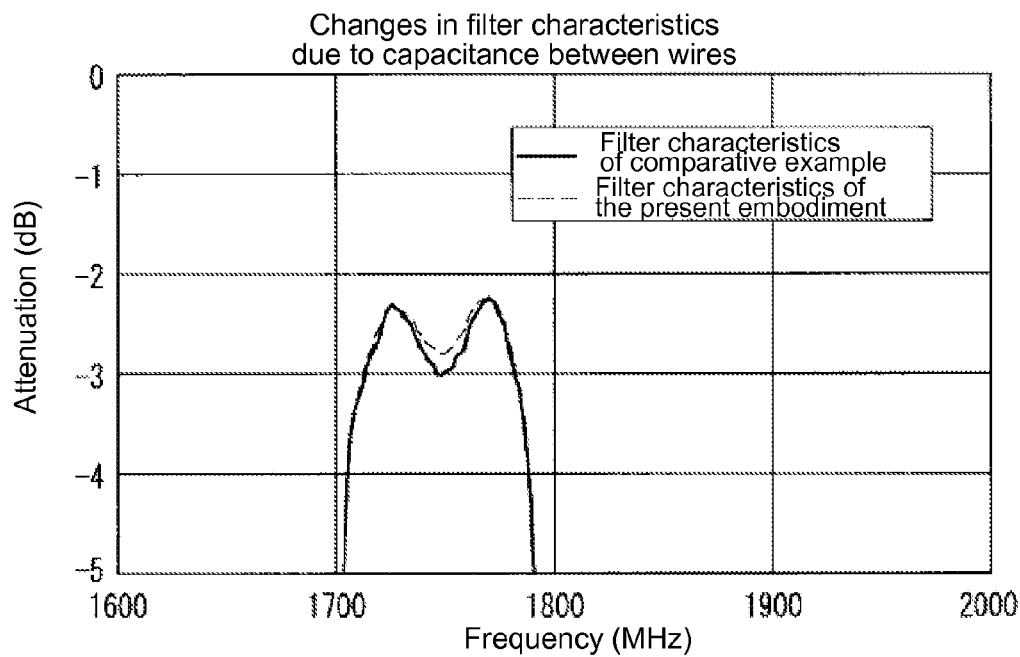
FIG. 3 is a characteristic chart representing changes in filter characteristics due to the distances between wires.

FIG. 3 shows changes in pass characteristics when the parasitic capacitance between the wiring portion and the series resonator is increased by 30% as in the aforementioned comparative example (solid line) and changes in pass characteristics of the acoustic wave filter of the present embodiment (dashed line). Thus, the characteristics shown by the solid line represent the pass characteristics of the acoustic wave filter of the comparative example in which the electrode interval D1 is 1 µm, and the characteristics shown by the dashed line represent the pass characteristics of the acoustic wave filter of the present embodiment in which the electrode interval D1 is 1 µm. As shown by the solid line in FIG. 3, it can be said that when the parasitic capacitance is increased by 30%, the pass characteristics degrade compared to the filter characteristics before the 30% increase in the parasitic capacitance (dashed line).

As described above, in the acoustic wave filter of the present embodiment, the parasitic capacitance C does not increase significantly even when the electrode interval D1 between adjacent electrodes is reduced in order to reduce the size of the acoustic wave filter. Therefore, degradation of pass characteristics can be reduced. As a result, the acoustic wave filter of the present embodiment can be reduced in size while ensuring sufficient pass characteristics.

Materials and film thickness dimensions of the piezoelectric substrate 1, the series resonator 2a, the parallel resonator 2b, the wiring portion 3, and the dielectric layer 4 used in the present embodiment are merely examples. As long as simulation results and filter pass characteristics that are similar to those of the present embodiment can be achieved, other materials and film thickness dimensions can be used.

Embodiment 2

Figure 4:
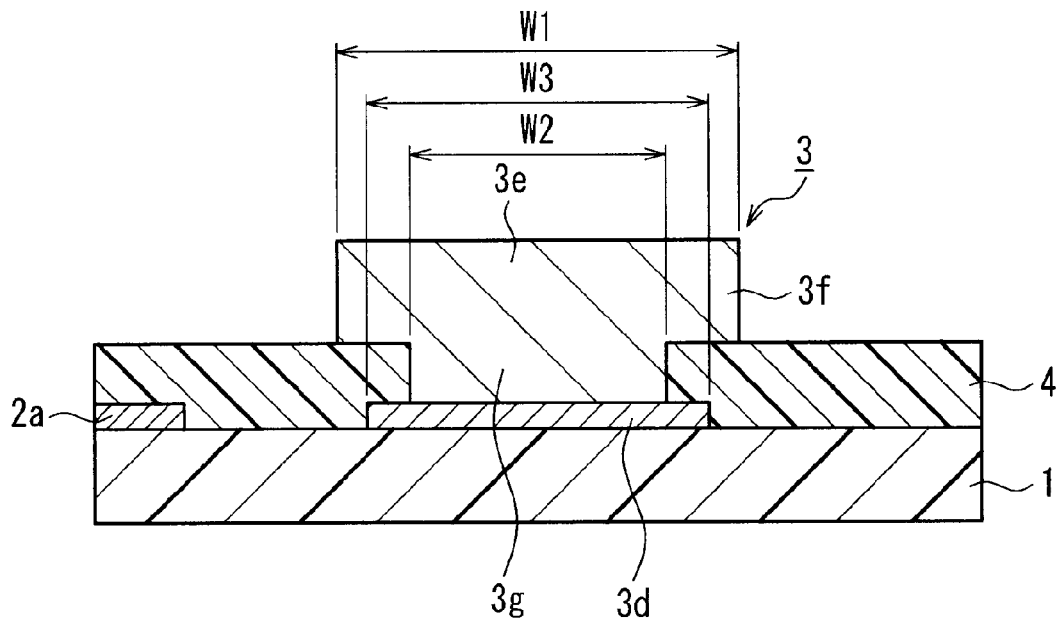
FIG. 4 is a partial cross-sectional view of an acoustic wave filter according to Embodiment 2.

FIG. 4 shows a partial cross-sectional view of a configuration of an acoustic wave filter according to Embodiment 2. The acoustic wave filter of Embodiment 2 features an electrode width W3 of a lower layer wiring portion 3d being wider than an electrode width W2 (width of an opening in a dielectric layer 4) of a lower layer portion 3g of an upper layer wiring portion 3e. Thus, an electrode width W1 of an upper layer portion 3f of the upper layer wiring portion 3e, the electrode width W2, and the electrode width W3 satisfy a relation of W1>W3>W2.

According to the acoustic wave filter shown in FIG. 4, since the volume of the upper layer wiring portion 3e in the proximity of a piezoelectric substrate 1 (i.e., the lower layer portion 3g) can be reduced by the amount receded from the edges of the lower layer wiring portion 3d, the parasitic capacitance C between electrodes that are adjacent to each other (in the present embodiment, between a series resonator 2a and a wiring portion 3) can be reduced further.

Embodiment 3

Figure 5:
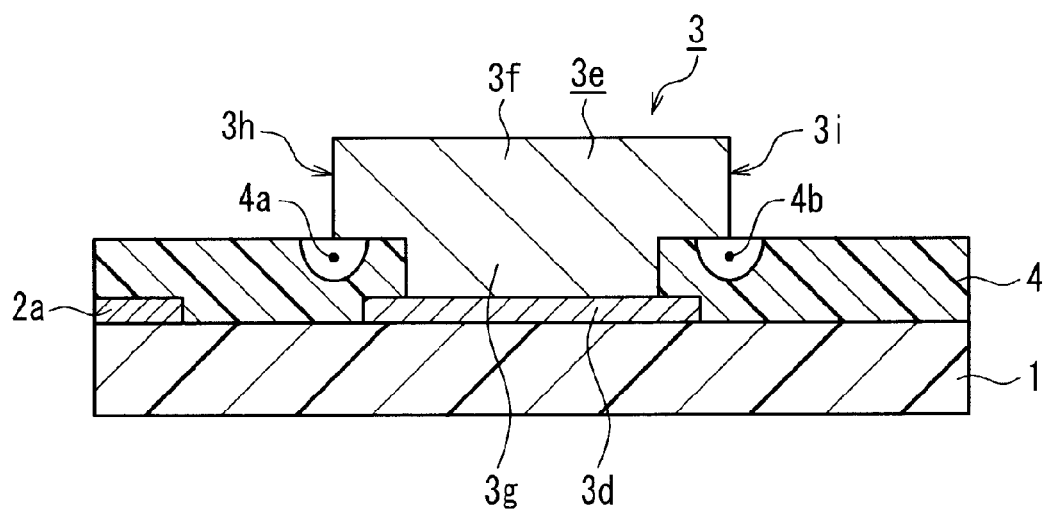
FIG. 5 is a partial cross-sectional view of an acoustic wave filter according to Embodiment 3.

FIG. 5 shows a partial cross-sectional view of a configuration of an acoustic wave filter according to Embodiment 3. An acoustic wave filter of Embodiment 3 is the acoustic wave filter of Embodiment 2 shown in FIG. 4, but has a configuration in which a portion of the dielectric layer 4 is removed. Specifically, recesses 4a and 4b are formed in regions of the dielectric layer 4 that were in contact with edge portions 3h and 3i of the upper layer portion 3f of the upper layer wiring portion 3e.

According to the acoustic wave filter shown in FIG. 5, an air layer having a permittivity $\epsilon$ that is lower than at least the permittivity of the dielectric layer 4 ($SiO_2$) can be provided between adjacent electrodes (in the present embodiment, between a series resonator 2a and a wiring portion 3) by removing regions of the dielectric layer 4 that were in contact with edge portions 3h and 3i of the upper layer portion 3f of the upper layer wiring portion 3e to form the recesses 4a and 4b. Thus, the parasitic capacitance C between electrodes that are adjacent to each other can be reduced further. Here, the permittivity $\epsilon$ of $SiO_2$ is approximately 2.1, and the permittivity $\epsilon$ of air is approximately 1.0.

When manufacturing the acoustic wave filter shown in FIG. 5, first, the acoustic wave filter of Embodiment 2 shown in FIG. 4 is manufactured. Then, a resist is patterned on the dielectric layer 4 to have openings at portions that correspond to the recesses 4a and 4b. Next, the dielectric layer 4 is etched using a wet etching method or the like to form recesses 4a and 4b. Lastly, the resist is removed.

Embodiment 4

Figure 6:
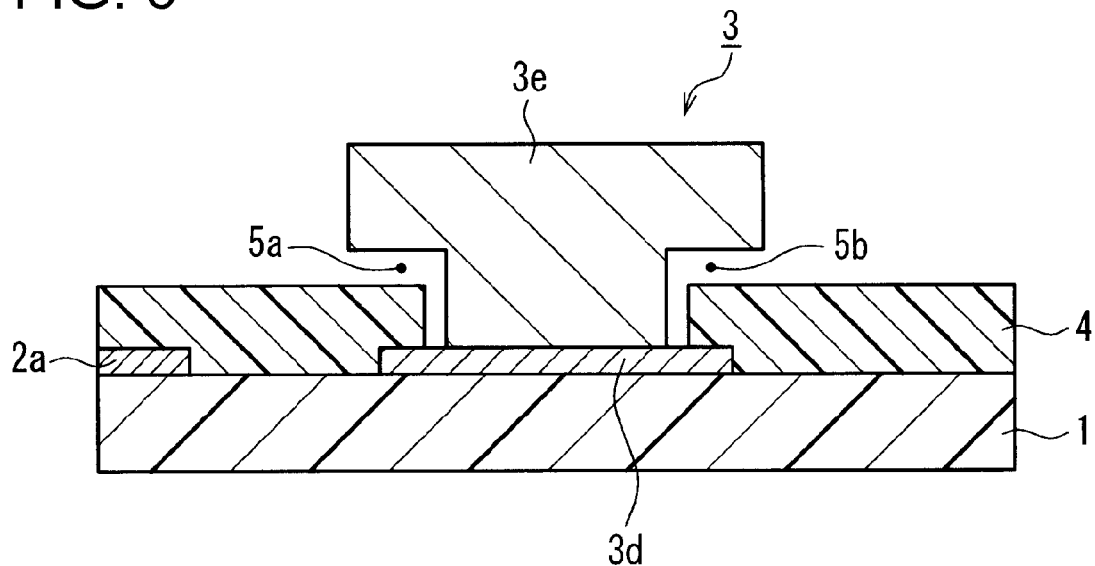
FIG. 6 is a partial cross-sectional view of an acoustic wave filter according to Embodiment 4.

FIG. 6 is a partial cross-sectional view of a configuration of an acoustic wave filter according to Embodiment 4. An acoustic wave filter of Embodiment 4 is the acoustic wave filter of Embodiment 2 shown in FIG. 4, but has a configuration in which air gaps 5a and 5b are formed between an upper layer wiring portion 3e and a dielectric layer 4. Thus, it has a configuration in which the upper layer wiring portion 3e and the dielectric layer 4 are not in contact with each other.

According to the acoustic wave filter shown in FIG. 6, the effective permittivity $\epsilon$ is reduced due to the formation of the air gaps 5a and 5b between the upper layer wiring portion 3e and the dielectric layer 4, and a parasitic capacitance C between electrodes that are adjacent to each other (in the present embodiment, between a series resonator 2a and a wiring portion 3) can be reduced further. Specifically, the permittivity $\epsilon$ is approximately 2.1 when only the dielectric layer 4 ($SiO_2$) is interposed between the electrodes. However, the permittivity $\epsilon$ is reduced toward 1.0 when the air gaps 5a and 5b (air layers) are formed as in the present embodiment.

Figure 7A:
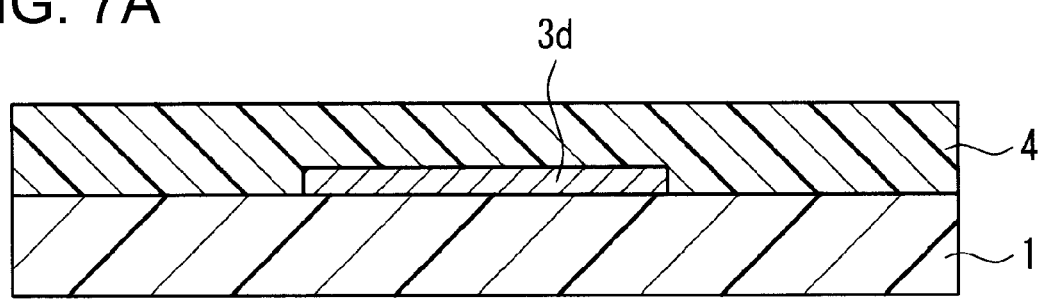
FIG. 7A is a cross-sectional view showing a manufacturing step of the acoustic wave filter of Embodiment 4.
Figure 7B:
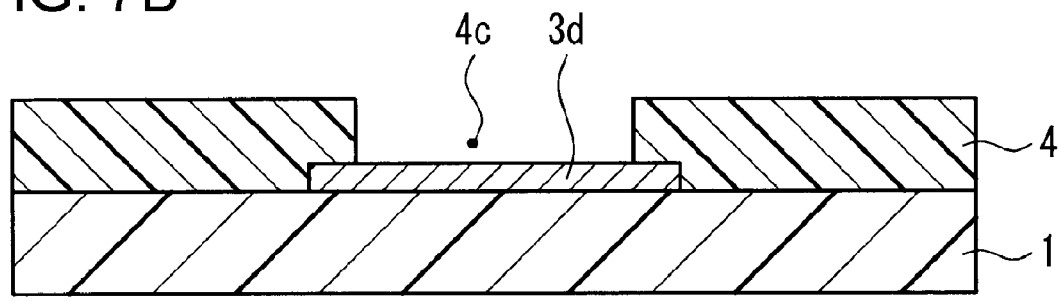
FIG. 7B is a cross-sectional view showing a manufacturing step of the acoustic wave filter of Embodiment 4.
Figure 7C:
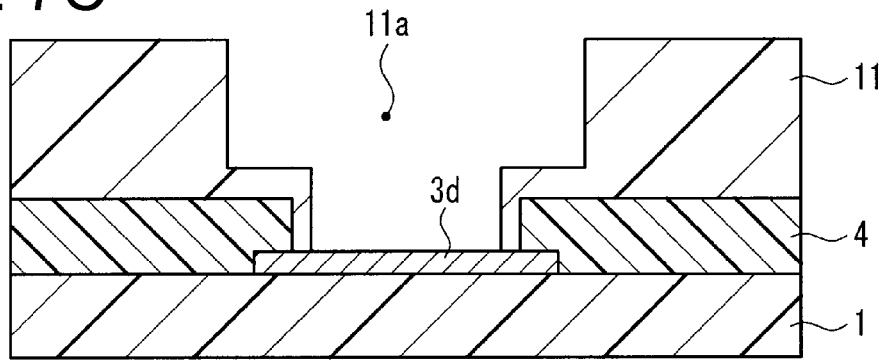
FIG. 7C is a cross-sectional view showing a manufacturing step of the acoustic wave filter of Embodiment 4.
Figure 7D:
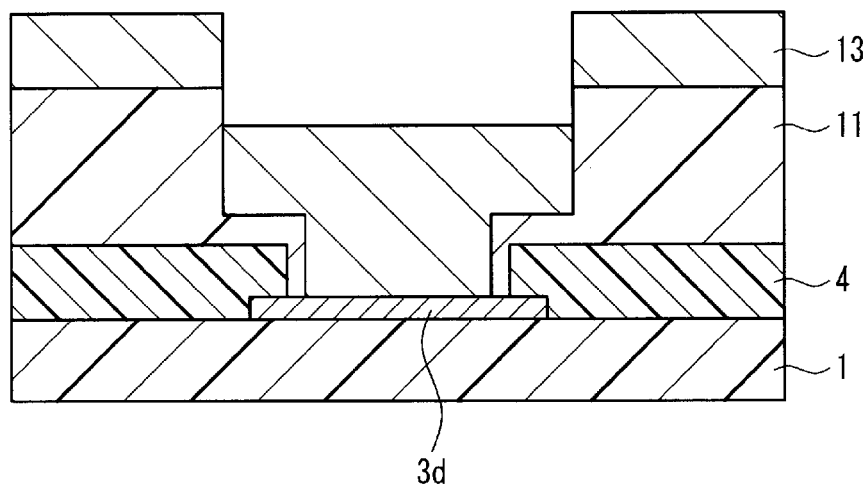
FIG. 7D is a cross-sectional view showing a manufacturing step of the acoustic wave filter of Embodiment 4.
Figure 7E:
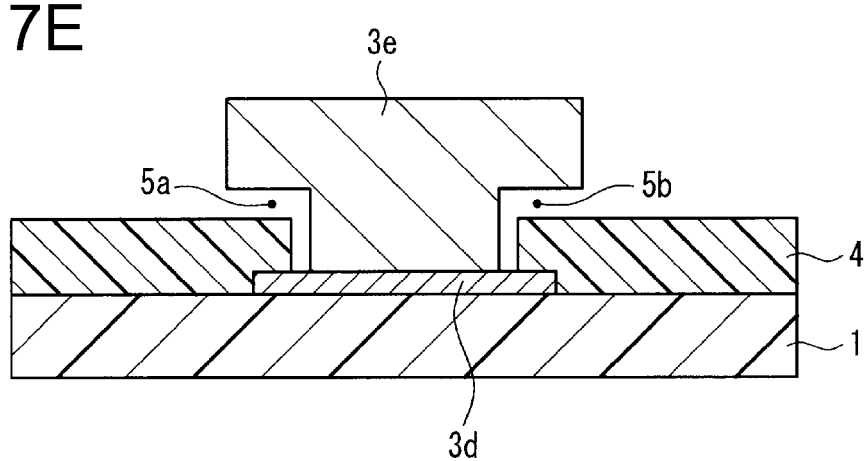
FIG. 7E is a cross-sectional view showing a manufacturing step of the acoustic wave filter of Embodiment 4.

FIGS. 7A to 7E are partial cross-sectional views showing manufacturing steps of the acoustic wave filter of Embodiment 4. When manufacturing the acoustic wave filter of Embodiment 4, first, an electrode film having Cu as the main component is formed using a sputtering method or a vapor deposition method on a piezoelectric substrate 1 that is formed of materials including $LiNbO_3$, and is patterned into a shape corresponding to a lower layer wiring portion 3d. Although not shown in the figure, comb-shaped electrodes 2c to 2f in a series resonator 2a and a parallel resonator 2b are formed at the same time during the step of forming the lower layer wiring portion 3d. Next, as shown in FIG. 7A, the dielectric layer 4 containing $SiO_2$ is formed on the piezoelectric substrate 1. Then, as shown in FIG. 7B, a portion of the dielectric layer 4 is removed by etching to form an air gap 4c. Then, as shown in FIG. 7C, on the lower layer wiring portion 3d and the dielectric layer 4, application, exposure, development, and post-bake of a positive-type resist 11 are performed twice to form a pattern having a step-like cross-sectional shape. When a negative-type resist is used as the resist, application and exposure are performed twice, and development and post-bake can be performed only once. Here, the resist 11 is formed to cover the dielectric layer 4. The resist 11 forms an air gap 11a that corresponds to the upper layer wiring portion 3e. Also, the resist 11 is formed such that a portion of the lower layer wiring portion 3d is exposed. Then, as shown in FIG. 7D, an electrode film 13 having Cu as the main component is formed on the resist 11 and the lower layer wiring portion 3d. Next, as shown in FIG. 7E, the resist 11 is removed. This way, the acoustic wave filter of Embodiment 4, which is provided with the air gaps 5a and 5b between the upper layer wiring portion 3e and the dielectric layer 4, can be manufactured.

Embodiment 5

Figure 8:
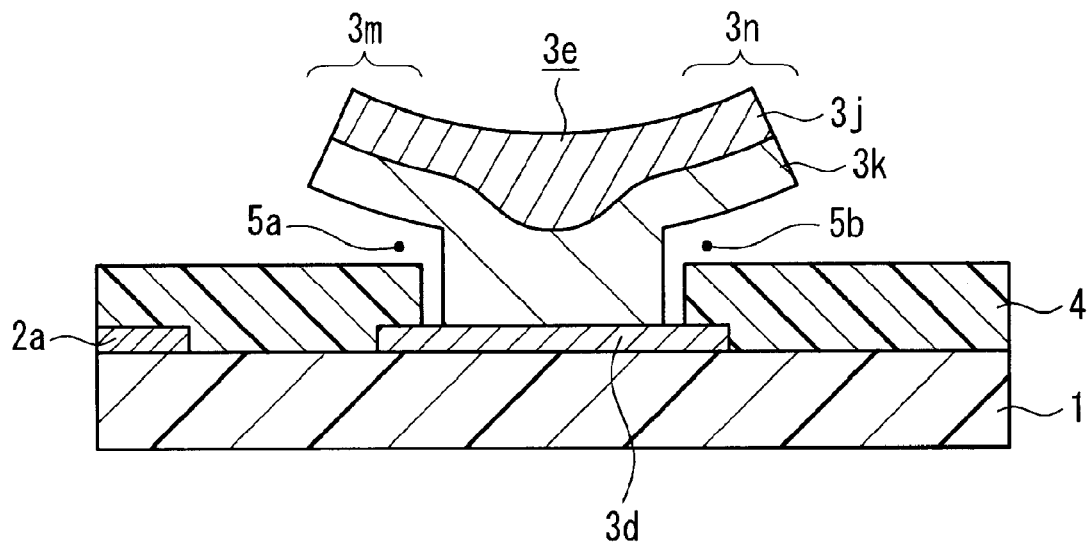
FIG. 8 is a partial cross-sectional view of an acoustic wave filter according to Embodiment 5.

FIG. 8 is a partial cross-sectional view showing a configuration of an acoustic wave filter according to Embodiment 5. An acoustic wave filter of Embodiment 5 is the acoustic wave filter of Embodiment 4 shown in FIG. 6, but has a configuration in which the upper layer wiring portion 3e is formed by laminating a plurality of metals, and the upper layer wiring portion 3e is deformed using a tensile stress or a compressive stress in the plurality of metal layers. Specifically, in the present embodiment, the upper layer wiring portion 3e has a two-layer configuration in which a first layer 3j and a second layer 3k are laminated. The first layer 3j preferably contains a material that has a tensile stress, and preferably contains titanium (Ti), for example. The second layer 3k preferably contains a material that has a compressive stress, and preferably contains copper (Cu), for example. Materials for the first layer 3j and the second layer 3k are not limited to these. Alternatively, the upper layer wiring portion 3e may have a configuration including three or more layers of metal films.

Because the upper layer wiring portion 3e has the first layer 3j and the second layer 3k having different stresses, either a tensile stress is generated in the first layer 3j or a compressive stress is generated in the second layer 3k when the upper layer wiring portion 3e is formed using a sputtering method or a vapor deposition method. Therefore, end portions 3m and 3n of the upper layer wiring portion 3e become deformed towards a direction away from a piezoelectric substrate 1. In the configuration shown in FIG. 8, the end portions 3m and 3n of the upper layer wiring portion 3e are warped upward. The end portions 3m and 3n are portions of the upper layer wiring portion 3e that face the piezoelectric substrate 1 through the dielectric layer 4. Thus, the distance between the upper layer wiring portion 3e and a series resonator 2a becomes larger than the distance between the upper layer wiring portion 3e and the series resonator 2a of the acoustic wave filter of Embodiment 4.

According to the acoustic wave filter shown in FIG. 8, the end portions 3m and 3n of the upper layer wiring portion 3e are warped away from the piezoelectric substrate 1 by stress by forming the upper layer wiring portion 3e by a metal multilayer film and by having the first layer 3j, which is the upper layer, contain a material that has a tensile stress or by having the second layer 3k, which is the lower layer, contain a material that has a compressive stress. Thus, the distance between adjacent electrodes (in the present embodiment, the distance between the series resonator 2a and the upper layer wiring portion 3e) becomes larger, thereby further reducing the parasitic capacitance C.

2. Configuration of Communication Module

Figure 9:
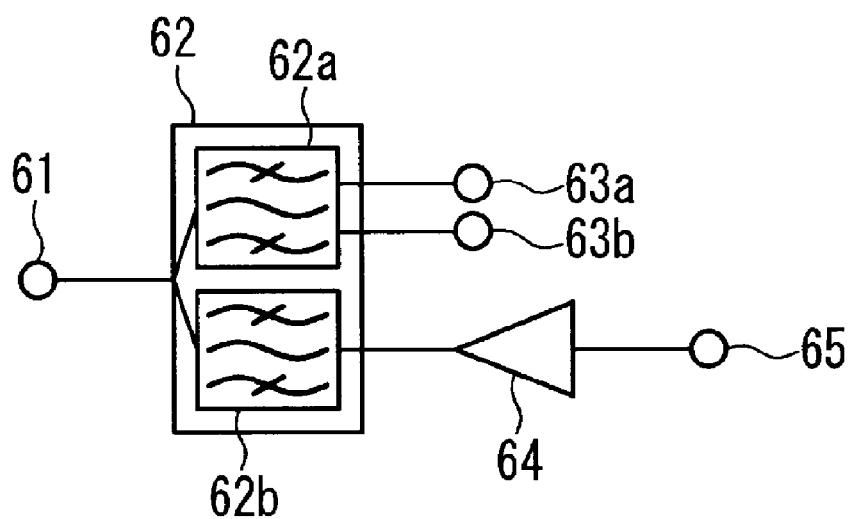
FIG. 9 is a block diagram of a communication module.

FIG. 9 shows one example of a communication module that is provided with an acoustic wave filter according to the present embodiments. As shown in FIG. 9, a duplexer 62 is provided with a receiving filter 62a and a transmission filter 62b. Receiving terminals 63a and 63b corresponding to balanced output, for example, are connected to the receiving filter 62a. Furthermore, the transmission filter 62b is connected to a transmission terminal 65 through a power amplifier 64. Here, the receiving filter 62a is provided with an acoustic wave filter according to any one of the embodiments of the present invention.

When a receiving operation is performed, the receiving filter 62a passes only the signals in a prescribed frequency range out of received signals inputted through an antenna terminal 61, and outputs them from the receiving terminals 63a and 63b to the outside. When a transmission operation is performed, the transmission filter 62b passes only the signals in a prescribed frequency range out of transmission signals that have been inputted from the transmission terminal 65 and that have been amplified in the power amplifier 64, and outputs them from the antenna terminal 61 to the outside.

By providing an acoustic wave filter of any one of the embodiments of the present invention in a communication module, the size of the module can be reduced while securing excellent pass characteristics The configuration of the communication module shown in FIG. 9 is merely an example, and similar effects can be obtained even when a communication module of other configurations is provided with a filter of the present embodiments.

3. Configuration of Communication Device

Figure 10:
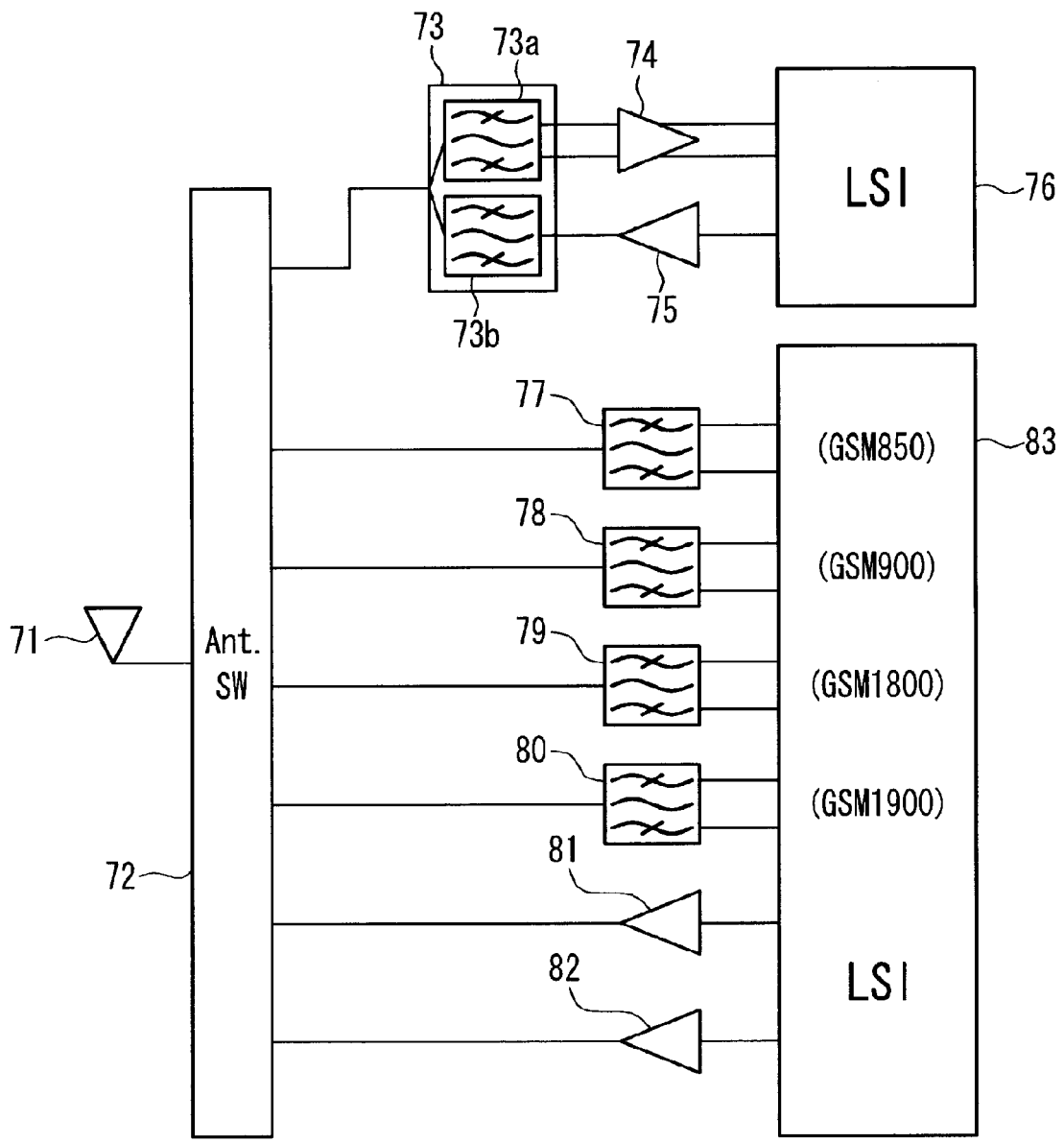
FIG. 10 is a block diagram of a communication device.

FIG. 10 shows an RF block diagram of a mobile phone terminal, which is an example of a communication device that is provided with an acoustic wave filter of the embodiments or the aforementioned communication module of the present invention. The communication device shown in FIG. 10 shows a configuration of a mobile phone terminal that is compatible with the GSM communication standard (Global System for Mobile Communications) and the W-CDMA (Wideband Code Division Multiple Access) communication standard. The GSM communication scheme of the present embodiment is compatible with an 850 MHz band, a 950 MHz band, a 1.8 GHz band, and a 1.9 GHz band. The mobile phone terminal is provided with a microphone, a speaker, a liquid crystal display, and the like, in addition to the configuration shown in FIG. 10. However, they are not shown in the figure since they are not necessary in the description of the present embodiment. Here, receiving filters 73a and 77 to 80 are provided with an acoustic wave filter according to any one of the embodiments of the present invention.

First, based on a received signal inputted through an antenna 71, an antenna switching circuit 72 selects an LSI that is the object of an operation depending on whether its communication standard is W-CDMA or GSM. If the received signal is compatible with the W-CDMA communication standard, the received signal is outputted to a duplexer 73. The received signal that is inputted to the duplexer 73 is controlled to be in a prescribed frequency range in the receiving filter 73a, and a balanced received signal is outputted to an LNA 74. The LNA 74 amplifies the inputted received signal and outputs it to an LSI 76. The LSI 76 performs a demodulation processing into an audio signal based on inputted received signals, and controls operations of respective parts of the mobile phone terminal.

On the other hand, when transmitting signals, the LSI 76 generates transmission signals. Generated transmission signals are amplified in a power amplifier 75 and are inputted to a transmission filter 73b. The transmission filter 73b passes only the signals in a prescribed frequency range out of the transmission signals inputted. The transmission signals outputted from the transmission filter 73b are outputted from the antenna 71 to the outside through the antenna switching circuit 72.

When an inputted received signal is a signal that is compatible with the GSM communication standard, the antenna switching circuit 72 selects one of the receiving filters 77 to 80 according to the frequency range, and outputs the received signal thereto. The received signal whose band is controlled in one of the receiving filters 77 to 80 is inputted to an LSI 83. The LSI 83 performs a demodulation processing into an audio signal based on the inputted received signal, and controls operations of respective parts of the mobile phone terminal. On the other hand, when transmitting signals, the LSI 83 generates transmission signals. Generated transmission signals are amplified in a power amplifier 81 or 82, and are outputted from the antenna 71 to the outside through the antenna switching circuit 72.

By providing an acoustic wave filter or a communication module of the embodiments of the present invention in a communication device, the size of the communication device can be reduced while securing excellent pass characteristics.

4. Effects of Embodiments

According to the embodiments of the present invention, the upper layer wiring portion 3e is not in direct contact with the piezoelectric substrate 1 having a high permittivity, and is disposed over the piezoelectric substrate 1 through the dielectric layer 4 having a lower permittivity than the piezoelectric substrate 1 by making the electrode width of the upper layer wiring portion 3e wider than the electrode width of the lower layer wiring portion 3d. This way, the parasitic capacitance formed between electrodes that are adjacent to each other can be reduced, while ensuring a low electric resistance of the wiring. Therefore, even when the distance between adjacent electrodes is reduced, the parasitic capacitance does not increase significantly, and the pass characteristics do not degrade significantly. As a result, the size of an acoustic wave filter, a communication module, and a communication device can be reduced while securing excellent pass characteristics.

Furthermore, unlike the insulating pattern disclosed in Patent Document 1, a member for insulating an electric field that forms a parasitic capacitance does not need to be provided separately. As a result, the present invention can be implemented at a low cost.

Furthermore, as shown in FIG. 4, by making the electrode width W2 of the lower layer portion 3g of the upper layer wiring portion 3e narrower than the electrode width W3 of the lower layer wiring portion 3d—i.e., by making the width size of the opening in the dielectric layer 4 filled by the lower layer portion 3g narrower than the electrode width W3 of the lower layer wiring portion 3d, the volume of the wiring layer in the proximity of the piezoelectric substrate 1 is reduced, and the parasitic capacitance can be reduced further in that example.

Furthermore, as shown in FIG. 5, by forming the recesses 4a and 4b in regions of the dielectric layer 4 that would be in contact with the end portions 3h and 3i of the upper layer wiring portion 3e, an air layer having a permittivity that is lower than at least the permittivity of the dielectric layer 4 (SiO₂) can be formed between adjacent electrodes, and the parasitic capacitance can be reduced further in that example.

Furthermore, as shown in FIG. 6, by forming the air gaps 5a and 5b so that the upper layer wiring portion 3e and the dielectric layer 4 are not in contact with each other, an air layer having a low permittivity can be present around all portions of the upper layer wiring portion 3e except for the portion that is in contact with the lower layer wiring portion 3d, and the parasitic capacitance can be reduced further in that example.

Furthermore, in the example shown in FIG. 8, the upper layer wiring portion 3e may be formed of a plurality of metal layers, and the metal layer of the first layer 3j, which is the upper layer, may be formed of a material having a tensile stress. This way, the end portions 3m and 3n of the upper layer wiring portion 3e may be lifted by the tensile stress of the first layer 3j. Moreover, the metal layer of the second layer 3k, which is the lower layer, may be formed of a material having a compressive stress so that the end portions 3m and 3n of the upper layer wiring portion 3e are lifted by the compressive stress of the second layer 3k. As a result, the distance between the upper layer wiring portion 3e and its adjacent electrode increases, thereby reducing the parasitic capacitance further in that example.

The piezoelectric substrate 1 of the present embodiments is one example of a piezoelectric substrate in the present invention. The comb-shaped electrodes 2e and 2f of the present embodiments are examples of comb-shaped electrodes in the present invention. The wiring portion 3 of the present embodiments is one example of a wiring portion in the present invention. The dielectric layer 4 of the present embodiments is one example of a dielectric layer in the present invention. The lower layer wiring portion 3d of the present embodiments is one example of a lower layer wiring portion in the present invention. The upper layer wiring portion 3e of the present embodiments is one example of an upper layer wiring portion in the present invention.

The present application is useful in an acoustic wave filter, a communication module, and a communication device.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two ore more of the embodiments and their modifications described above can be combined and regarded within the scope of the present invention.

The invention claimed is:

1. An acoustic wave filter, comprising:
a piezoelectric substrate;
a comb-shaped electrode formed on said piezoelectric substrate;
a wiring portion connected to said comb-shaped electrode; and
a dielectric layer formed to cover said comb-shaped electrode,
wherein said wiring portion comprises a lower layer wiring portion disposed in a same layer as said comb-shaped electrode and an upper layer wiring portion disposed over said lower layer wiring portion,
wherein said upper layer wiring portion has an upper portion and a lower portion, and a width of the upper portion of said upper layer wiring portion is greater than a width of the lower portion of said upper layer wiring portion,
wherein the width of the lower portion of the upper layer wiring portion is smaller than a width of the lower layer wiring portion, and
wherein the width of the upper portion of the upper layer wiring portion is greater than the width of the lower layer wiring portion.

2. An acoustic wave filter, comprising:
a piezoelectric substrate;
a comb-shaped electrode formed on said piezoelectric substrate;
a wiring portion connected to said comb-shaped electrode; and
a dielectric layer formed to cover said comb-shaped electrode,
wherein said wiring portion comprises a lower layer wiring portion disposed in a same layer as said comb-shaped electrode and an upper layer wiring portion disposed over said lower layer wiring portion,
wherein said upper layer wiring portion includes a wider portion having a wider width than an width of said lower layer wiring portion,
wherein an electrode width of a bottom of said upper layer wiring portion that is in contact with said lower layer wiring portion is narrower than the width of said lower layer wiring portion, and
wherein an air gap is formed between said upper layer wiring portion and said dielectric layer.

3. A communication device comprising an antenna and the acoustic wave filter set forth in claim 2 connected to the antenna.

4. The acoustic wave filter according to claim 2, wherein said upper layer wiring portion comprises a plurality of metal layers, and
wherein one of said plurality of metal layers is formed of a material having a tensile stress or a material having a compressive stress.

5. The acoustic wave filter according to claim 2, wherein said upper layer wiring portion has upper side portions that protrude from a lower portion of said upper layer wiring portion and the protruded upper side portions are respectively warped upward away from the piezoelectric substrate.

6. A duplexer comprising a receiving filter and a transmission filter, wherein at least one of the receiving filter and the transmission filter is the acoustic wave filter according to claim 2.

7. A communication module comprising an antenna and the duplexer set forth in claim 6 connected to the antenna.

8. A communication device comprising the communication module set forth in claim 7 and an LSI communication unit connected to the communication module.

9. An acoustic wave filter, comprising:
a piezoelectric substrate;
a comb-shaped electrode formed on said piezoelectric substrate;
a wiring portion connected to said comb-shaped electrode; and
a dielectric layer formed to cover said comb-shaped electrode,
wherein said wiring portion comprises a lower layer wiring portion disposed in a same layer as said comb-shaped electrode and an upper layer wiring portion disposed over said lower layer wiring portion,
wherein said upper layer wiring portion has an upper portion and a lower portion, and a width of the upper portion of said upper layer wiring portion is greater than a width of the lower portion of said upper layer wiring portion, and wherein an air gap is formed between the upper layer wiring portion and the dielectric layer.

10. The acoustic wave filter according to claim 9, wherein the width of the lower portion of the upper layer wiring portion is substantially the same as a width of the lower layer wiring portion.

11. The acoustic wave filter according to claim 9, wherein the air gap separates the upper layer wiring portion from the dielectric layer so that the upper layer wiring portion is not in contact with the dielectric layer.

12. The acoustic wave filter according to claim 11, wherein the upper portion of the upper layer wiring portion has upper side portions that are warped upward away from the piezoelectric substrate.

13. The acoustic wave filter according to claim 9, wherein the width of the lower portion of the upper layer wiring portion is smaller than a width of the lower layer wiring portion.

* * * * *